United States Patent
Zeberinsh

(12) 
(10) Patent No.: US 6,517,692 B1
(45) Date of Patent: Feb. 11, 2003

(54) APPARATUS FOR FLOW-LINE TREATMENT OF ARTICLES IN AN ARTIFICIAL MEDIUM

(75) Inventor: Arthur Zeberinsh, Riga (LV)

(73) Assignees: Vacumetal B.V., Oosterhout (NL); A/S Sidrabe, Riga (LV)

( * ) Notice: Subject to any disclaimer, the term of this patent is extended or adjusted under 35 U.S.C. 154(b) by 0 days.

(21) Appl. No.: 09/807,405

(22) PCT Filed: Oct. 13, 1999

(86) PCT No.: PCT/NL99/00634

§ 371 (c)(1),
(2), (4) Date: Aug. 22, 2001

(87) PCT Pub. No.: WO00/22186

PCT Pub. Date: Apr. 20, 2000

(30) Foreign Application Priority Data

Oct. 13, 1998 (EP) .............................................. 98203444

(51) Int. Cl.[7] .......................... C23C 14/35; C23C 16/00; C23F 1/02; B05C 13/00; B65H 1/00

(52) U.S. Cl. ............................ 204/298.27; 204/298.41; 204/298.35; 204/298.25; 156/345.31; 118/723 VE; 118/729; 118/500; 414/222.03; 414/222.04; 414/222.13

(58) Field of Search ....................... 204/298.23, 298.25, 204/298.27, 298.35, 298.16, 298.15, 298.41; 156/345, 345.31; 118/723 VE, 724, 729, 500; 414/222.03, 222.04, 222.13

(56) References Cited

U.S. PATENT DOCUMENTS

| 3,260,383 A | | 7/1966 | Fitzgerald ..................... 214/17 |
| 3,833,018 A | | 9/1974 | Brooks .................. 137/625.47 |
| 5,340,454 A | * | 8/1994 | Schaefer et al. ....... 204/192.12 |
| 6,086,728 A | * | 7/2000 | Schwart et al. ........ 204/192.12 |

FOREIGN PATENT DOCUMENTS

| EP | 0837154 | 4/1998 |
| FR | 1496205 | 12/1967 |

* cited by examiner

Primary Examiner—Steven Versteeg
(74) Attorney, Agent, or Firm—Banner & Witcoff Ltd.

(57) ABSTRACT

An apparatus for flow-line treatment of articles has two chambers. The first chamber is a vacuum working chamber to treat articles in an artificial atmosphere. First transport means transport articles through the first chamber and at least one lock at the end of the chamber. Second transport means transport articles though the second chamber. The lock has a movable body with at least two cavities, installed inside an airtight shell. The movable body moves between a first position, in which one cavity connects with the first chamber and the first transport means extend into the cavity, and a second position, in which the cavity connects with the second chamber and the second transport means extend into the cavity. The at least two cavities are adjacent and similar and are provided with openings. Each cavity holds one carrier with articles. The first and second transport means provide simultaneous and antiparallel movement.

19 Claims, 6 Drawing Sheets

APPARATUS FOR FLOW-LINE TREATMENT OF ARTICLES IN AN ARTIFICIAL MEDIUM

BACKGROUND OF THE INVENTION

Generally this invention relates to an apparatus for flow-line treatment of articles in an artificial medium different from ambient atmosphere.

More specifically, the invention relates to an apparatus serving for flow-line treatment and coating articles, preferably three-dimensional parts, in an artificial gas medium or in vacuum. A feature of this apparatus is that operation of the treatment means and preset characteristics of the artificial medium are maintained much longer than it is necessary for treatment of a solitary article, and these articles are transported along the treatment zones through the locking chambers. Application of the apparatus of this type is well known for treatment of flat thin articles such as architectural glass, compact disk blanks or chips. However, apparatus of this type may be used most widely in the systems of deposition of metals or their compounds in high vacuum or an atmosphere of inert or reactive gases.

Another specification of the field of application is the apparatus for the flow-line treatment of certain number of articles, that is sets of parts fixed on a common carrier and transported as a whole during the process. Application of such apparatus is known for manufacture of small sized articles such as optical lenses, car light reflectors with antireflection or light reflecting coating mainly on one of the sides.

In a specific embodiment the proposed invention is an apparatus for flow-line treatment of the sets of articles on carriers in artificial and vacuum media, providing all-round metal or metal-containing coatings on three-dimensional articles such as plastic parts.

An apparatus for continuous metallizing of components, U.S. Pat. No. 5,622,564 of Apr. 22, 1997 was considered as the prior art. The apparatus comprises:

at least one vacuum working chamber provided with treatment means for processing of the articles;

means for maintaining the artificial atmosphere in the working chamber;

locks in ends of the vacuum working chamber;

a set of carriers for transportation the articles under treatment through at least one working chamber and the locks; and loading and unloading devices in the ambient atmosphere and transport means for carriers.

In the prior art, the flow-line apparatus comprises the working chamber and locking chambers at its ends that all are arranged along a common horizontal line. The locking chambers with shutters are separated by gates between themselves and from the atmosphere. All chambers along their length are provided with rails, which form a general track for carriers travel, with travel drives, travel holdup stoppers, as well as with air evacuation and admittance means.

The working chamber is provided with a metal vapour source. Metal is supplied for evaporation in the form of wire. The carriers for components are made as carriages, comprising holders of the components, fixed to be rotating relative longitudinal horizontal axis and driven into revolution when stoppers delay carrier transportation.

As the design of the flow-line gates or of locks is not described in the prior art patent, it gives a ground to consider them in similar to known units, as for example described in EP-A-0 554 522 of Aug. 11, 1993.

Such unit comprises a stationary part in the form of opening and corresponding shutter, closing this opening.

The shutter is provided with means for effective travelling along the opening and force movement to deform resilient sealing, which is along the opening perimeter.

In this case the closed structure must resist significant forces arising at a pressure difference on the shutter. Pointed out circumstances are determined by the basic disadvantage of all similar units—their restricted operation speed (due to the movement character) and quick wearing out or the sealant exposed to constant changes of stress conditions within a significant part of elasticity range of the shutter material.

FR-A-1.496.205 describes an apparatus for flow-line treatment of articles under artificial atmosphere, the said apparatus comprising:

at least one vacuum working chamber provided with treatment means for processing of the articles;

means for maintaining the artificial atmosphere in the said working chamber;

locks in the ends of the vacuum working chamber;

transport means for transporting the articles through at least one working chamber and the locks;

loading and unloading devices in the ambient atmosphere, and transportation means wherein each of the locks comprises a movable body, installed inside airtight shells, the body comprises at least one cavity;

the body is movable between a first position, in which the cavity is in connection with the first chamber and the transport means in the first chamber extends into the cavity, and a second position, in which the cavity is in connection with a second chamber, being located at the other side of the lock, while the transport means in the second chamber extend into the cavity; and wherein the gap between the shell and the body is an air gap seal.

In this prior art document both at the supply side and at the unload side a lock or a set of locks is required. This leads to a costly construction.

SUMMARY OF THE INVENTION

One object of the present invention is to provide such an apparatus which can be built at lower costs.

This aim is reached in that the body comprises at least two cavities, which are adjacent and similar and are provided with openings, that each cavity is made with the volume for one, carrier with articles; and that the transport means are made for simultaneous and antiparallel movement in both paired locking compartments.

This aim is reached in that the body comprises at least two cavities, which are adjacent and similar and are provided with openings, that each cavity is made with the volume for one carrier with articles; and that the transport means are made for simultaneous and antiparallel movement in both paired locking compartments.

The loading/unloading unit is in communication with the locking compartments of the locks at one position of the latter.

At the opposite position the adjacent locking compartments are communicated with the compartments of the next locks.

Another end of the apparatus is formed by a lock between two chambers with the highest vacuum in the system and has no output to the ambient atmosphere.

BRIEF DESCRIPTION OF THE DRAWINGS

Details and interconnections of some embodiments of the suggested invention are presented graphically in nine figures, identified as FIGS. 1–9.

FIG. 1 shows a fragment of the loading part of the apparatus in the simplest embodiment.

FIG. 2 shows an embodiment of the apparatus with nonreversible transportation of the carriers with the articles.

FIG. 3 shows the apparatus embodiment of all-round activation and deposition of three-dimensional articles with the joint loading/unloading unit at one end of the system.

DETAILED DESCRIPTION OF THE PREFERRED EMBODIMENTS

Figure 1:
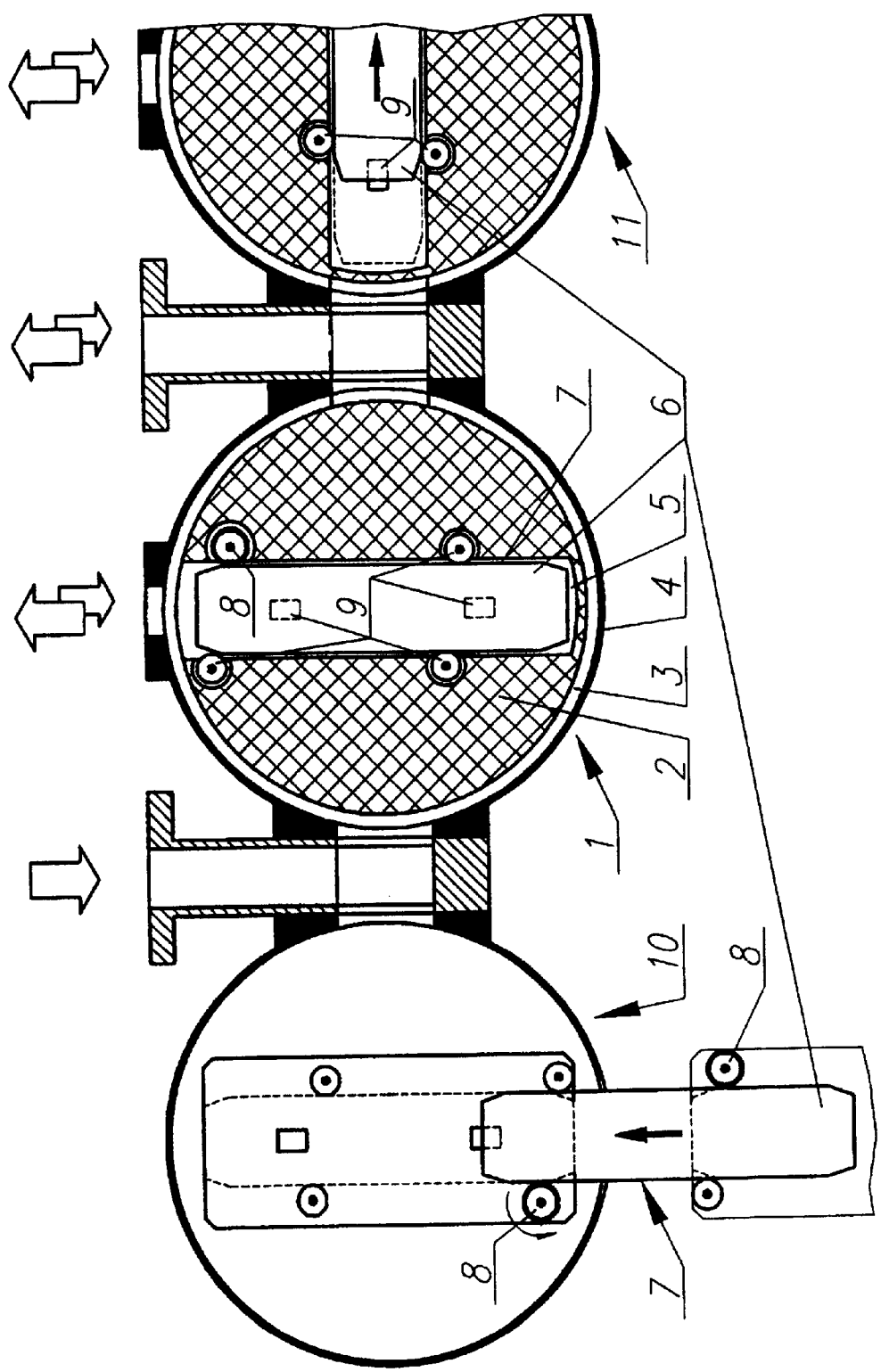
FIGS. 1–3 comprise the diagrams of horizontal cross sections of the apparatus embodiments (it should be mentioned here that in FIGS. 1–3 carriers 6 with articles are shown simplified as one whole).

A lock 1, which is presented in FIG. 1, is formed by a body of revolution 2, placed with minimum clearance 3 in a sealed shell 4 and containing cavity 5, into which a carrier 6 with articles may be introduced. The carrier 6 is fixed in the cavity 5 with drive rollers 8 and bearing rollers 9 along the bearing path 7. These rollers form the means of transportation of the carriers 6 with the articles inside and outside the cavity 5. A shell 4 is connected to and may communicate with a loading unit 10, containing similar rollers 8 and 9 as the transportation means.

At the opposite end the shell 4 is connected to and may communicate with the next component 11 of the apparatus. Here another lock is shown as the next component, but it may be a working chamber as well. As necessary the shells 4 and/or their joints with each other can be connected also to means with working media displacement (marked with wide arrows in all drawings), for example, as appropriate vacuum pumps, inlet valves and their combinations.

Locking processes of the apparatus are performed in alternating phases of medium displacement and transportation of the carriers with articles through the locks, divided by unidirectional ¼ or ½ revolutions of the body of revolution and changing position of the cavity 5 axis into longitudinal or transverse position. It is preferable to make the revolutions uniformly accelerated, changing acceleration sign at the medium point of the revolution at possible minimum duration of the operation.

The rollers 8 and 9 operate in similar way during movement of the carriers 6, but only in moments when axis of the cavity 5 is parallel to general axis of the apparatus and with alteration of the operation direction in accordance with the position of the open end of the cavity 5. The bodies of revolution of all the apparatus rotate with equal or half-value frequencies, preferably, with lagging by the value of single revolution duration. Operation of the rollers 8 and 9 of adjacent legs in the direction of transportation should be cophased and synchronous.

In case of the above described design and operation bodies of revolution 2 and shells 4 form the locks with the chambers in the form of the cavities 5. Each couple of adjacent locks forms a locking stage in the form of combination of adjacent locking cavities and interspaces between them. Dynamic resistance to gas flows along rather long and narrow gaps 3 serves as means of locking spaces separation instead of moving shutters with resilient seals, as in the prior art. Conductivity of the gaps is determined to a great extent by the gap width. Therefore it is possible to limit gases inflow value by minimising this width during locking cycle down to a value not greater than a fraction of the cavity free volume, taking into account dynamics of the process. Absence of quickly weared out parts is the advantage of such technical solution. This increases lifetime and reliability of the apparatus, when only simple revolution movement mainly against inertial forces is necessary. That allows also to increase operation speed. In the simplest embodiment, shown in FIG. 1, complete locking cycle demands one revolution of the body of revolution 2.

Figure 2:
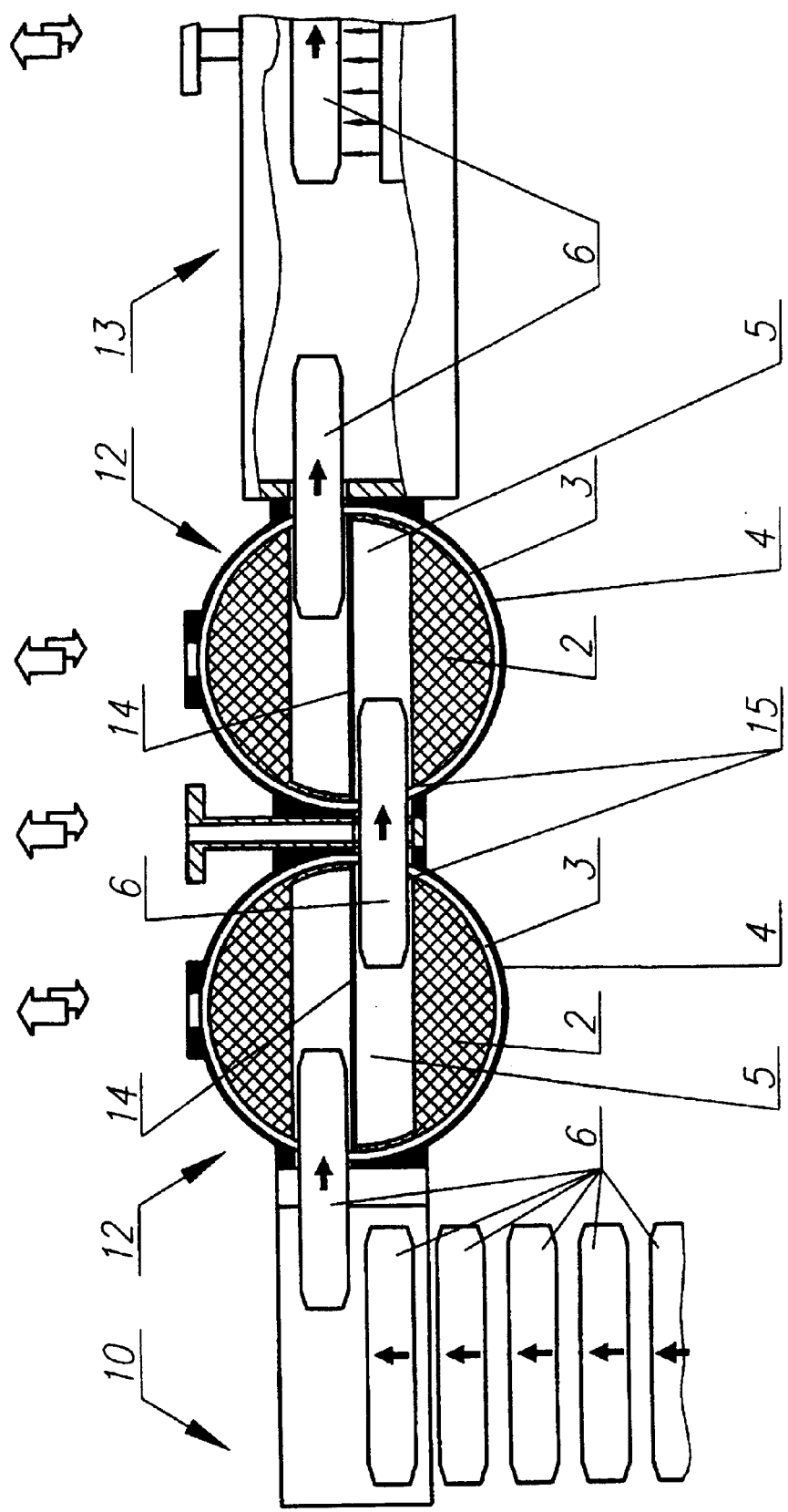

In an improved embodiment number of locking cycles per one revolution may be doubled to increase operation speed. Such an example is schematically shown in FIG. 2, where the input end of the apparatus is at the stage of carriers transportation: the loading arrangements 10, two locks 12 (another embodiment of the locks) and a part of the working chamber 13. The improvement here is in the following: the cavities of the locks 12 are provided with bulkheads 14 between two locking compartments 5 and the carriers transportation means (not shown) are able to operate synchronously but in opposite directions. In this particular case openings 15 are arranged to provide the locks reloading in half a revolution of the body of revolution 2.

Figure 3:
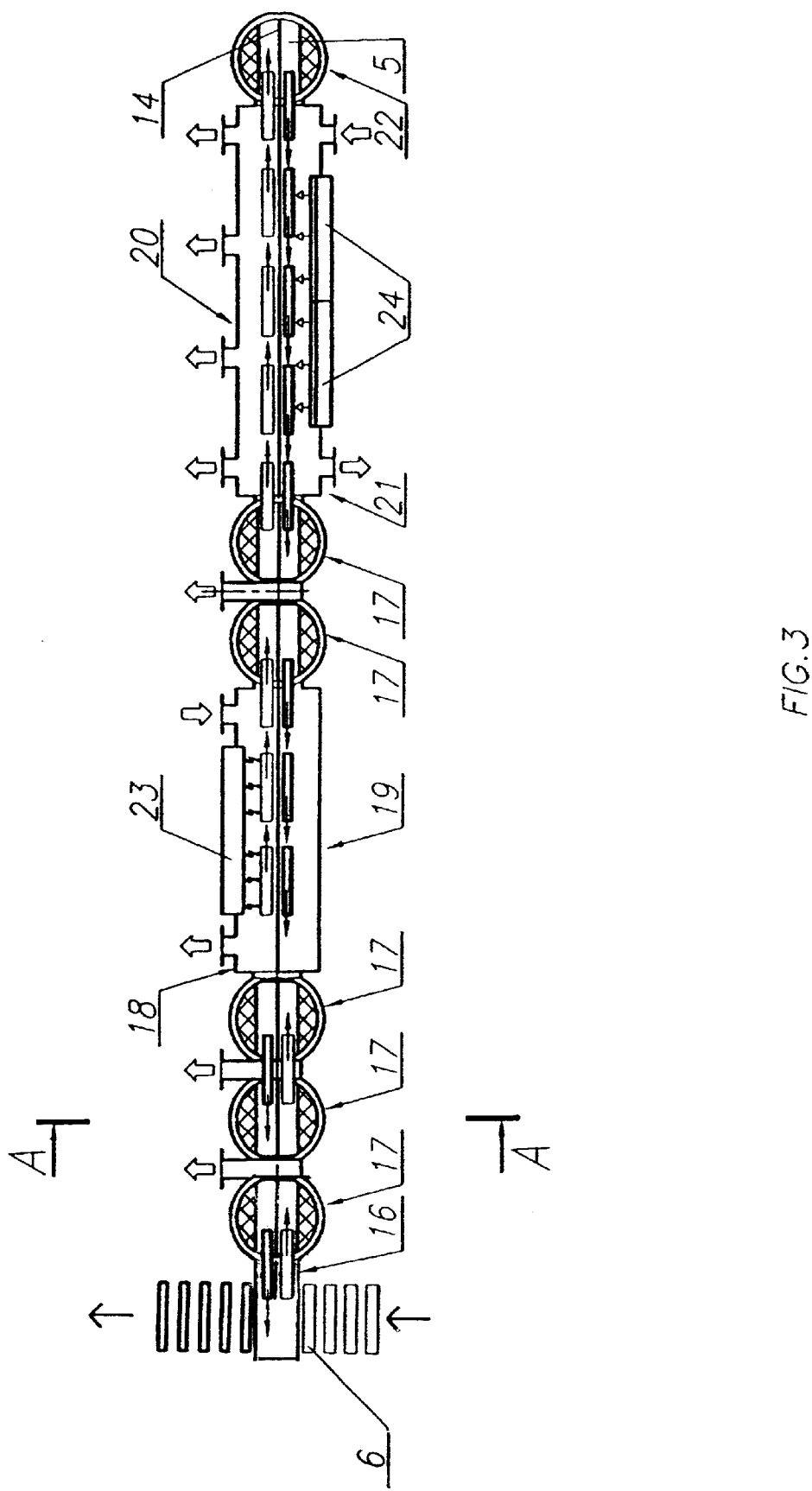

However, in case of adjacent arrangement of openings 15 the described improvement is more effective, because it enables to provide synchronous locking of counterflows of the carriers with articles. These possibilities are illustrated by a flow-line deposition apparatus, which is schematically shown in FIG. 3. This apparatus includes a line of connected components capable to communicate with each other in sequence.

There is a loading/unloading unit 16 at the beginning of the line and following three locks 17, an activation chamber 18 with passivation chamber 19, parallel to the latter, locks 17, a high vacuum outgassing chamber 20 and a high vacuum deposition chamber 21, an end lock 22. The high-vacuum deposition chamber 21 and the high-vacuum outgassing chamber 20 are the working chambers with the lowest pressure in this apparatus. All working chambers are provided with means of carriers transportation, maintenance of required environmental characteristics and corresponding treatment mains (glow discharge electrodes 23 and sources 24 of the deposited material vapours are shown as examples).

All locks 17 and 22 comprise two locking compartments 5, corresponding means of the carriers transportation can operate synchronously in antiparallel directions in these locking compartments. At the end of this apparatus the locking compartments of the lock 22 are made with openings at both ends. All the locks of the apparatus operate as it was mentioned above at consecutive rotations of all the bodies of revolutions by ½ revolution.

According to the offered apparatus and its operation character each carrier with articles arrives to the loading/ unloading unit and travels further consecutively within parallel counterflows. During transportation surfaces of the articles are exposed consecutively to glow discharge plasma activation, outgassing, coating with metals or their compounds in the deposition chamber and the coating passivation in low pressure oxidising environment or, if necessary, in plasma.

Flows of gases in the locks are cut twice, while volumes of counterflows act as an addition to the means of media substitution in the locks. These factors provide additional advantages of the described apparatus in increase of operation speed and, consequently, its productivity. Number of the components, necessary to provide locking process, is decreased.

It further decreases wear of the apparatus, improves its reliability.

Figure 4:
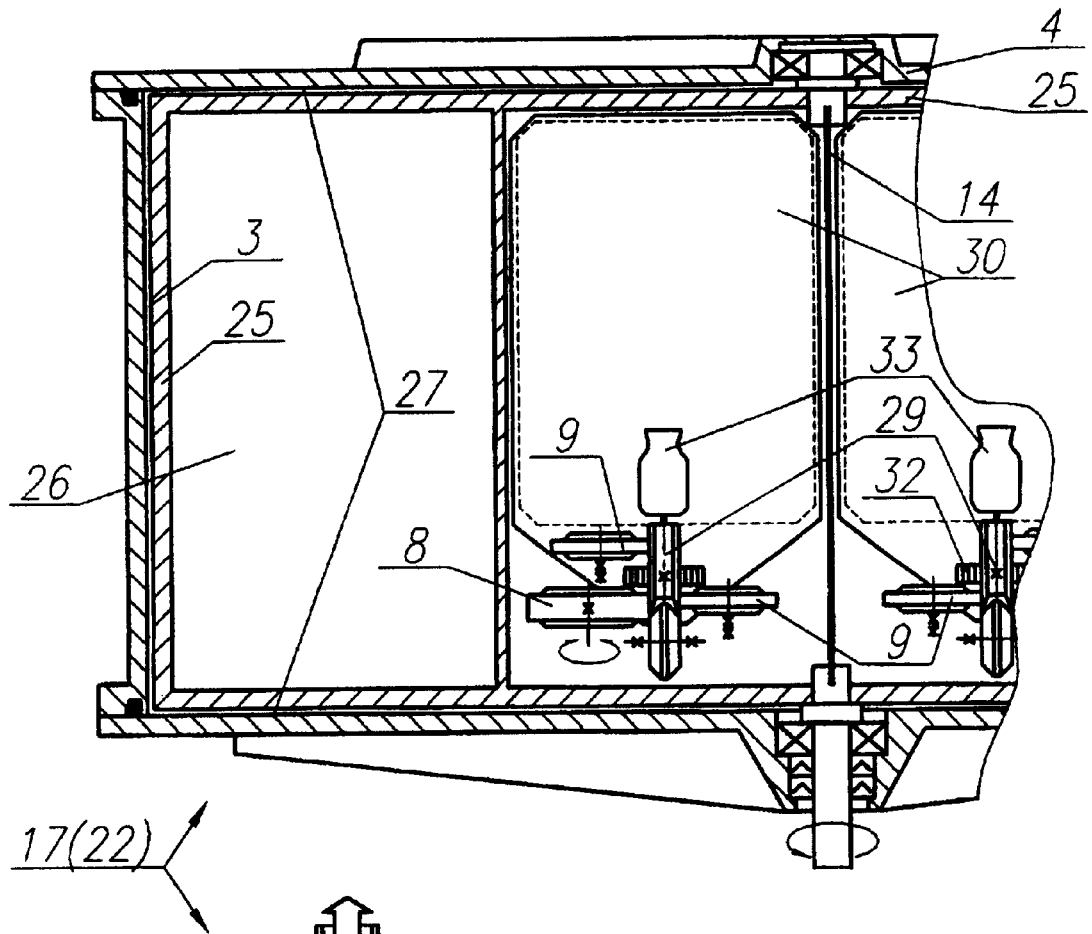
FIGS. 4 and 5 comprise more detailed drawings of the locks cross-sections with various versions of the bodies of rotation.

The design of locks 17 or 22 is shown more in detail in FIG. 4, which corresponds to A—A cross section in FIG. 3. The lock is formed by an airtight shell 4 with the body of revolution 25, installed inside the shell. In this case the body of revolution 25 is formed by hollow straight cylinder, but it is similar to the body of revolution 2 in other embodiments of the apparatus. The advantage of such solution is that minimum of locking volume is combined with minimum of inertial counteraction to rotation acceleration, while the cylinder has maximum processability during manufacture.

In this embodiment the body of revolution 25 may contain inert gas with marker properties, for example, helium at pressure no more than $\frac{1}{10}$ of atmospheric level, in cavity (cavities) 26.

Such pressure of the inert gas in the airtight body of revolution 25 is a compromise to the pressure outside the surfaces the body of revolution 25, whose walls have limited rigidity. Under these conditions the pressure inside the body of revolution limits fluctuation of the gaps 3 and 27, providing, together with other factors, minimum size of the gaps. On the other hand, geometrically complicated walls of the body of revolution, which is continually loaded with alternating pressure forces, need control of their airtightness during long operation of the apparatus. Marker properties of the gas will assist to such control.

In the considered embodiment the gap 3 between the body of revolution 25 and the shell 4 is bypassed by the end gaps 27. Limiting the end gaps width at the level of ½ of the gaps 3 provides sufficient decrease of bypassing effect, if consider at least cubic relationship between throughput capability and the gap width.

Figure 5:
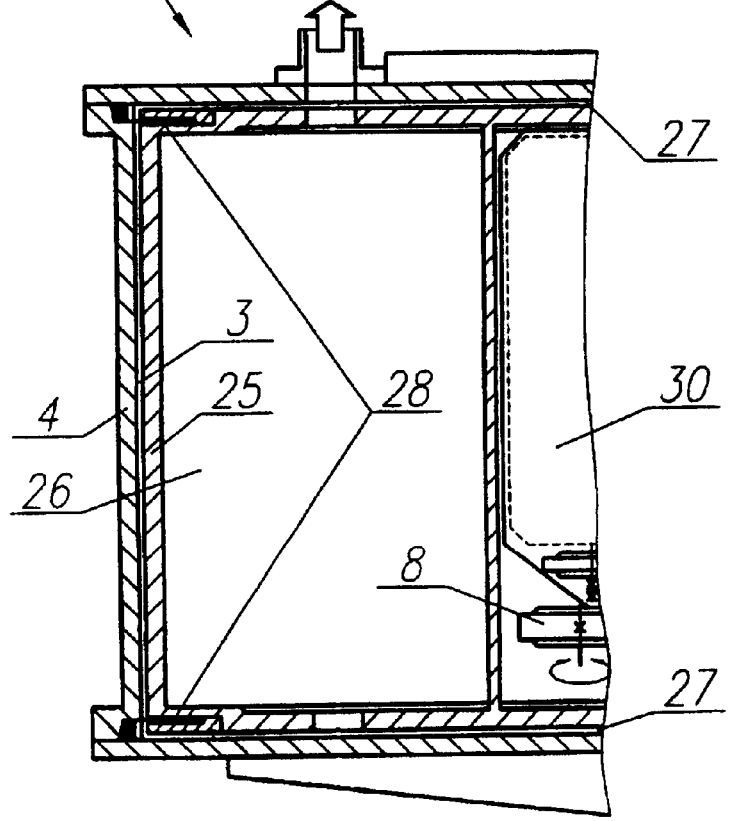

In another embodiment of the lock, shown in FIG. 5, bypass effect of the end gaps is eliminated by sliding gaskets 28, and pressure level in the cavities 26 is fixed by their connection with end gaps 27, which are connected to the medium replacement means.

Figure 8:
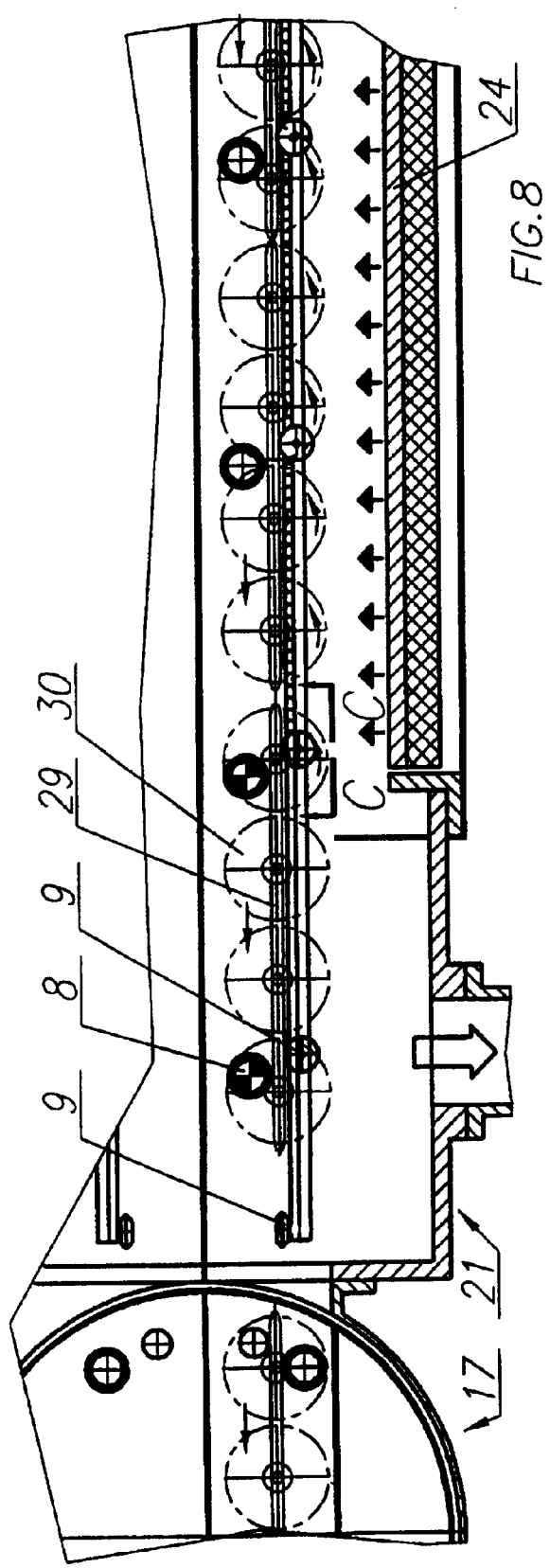
FIGS. 8 and 9 show the means of the articles transportation in the working chamber.
Figure 9:
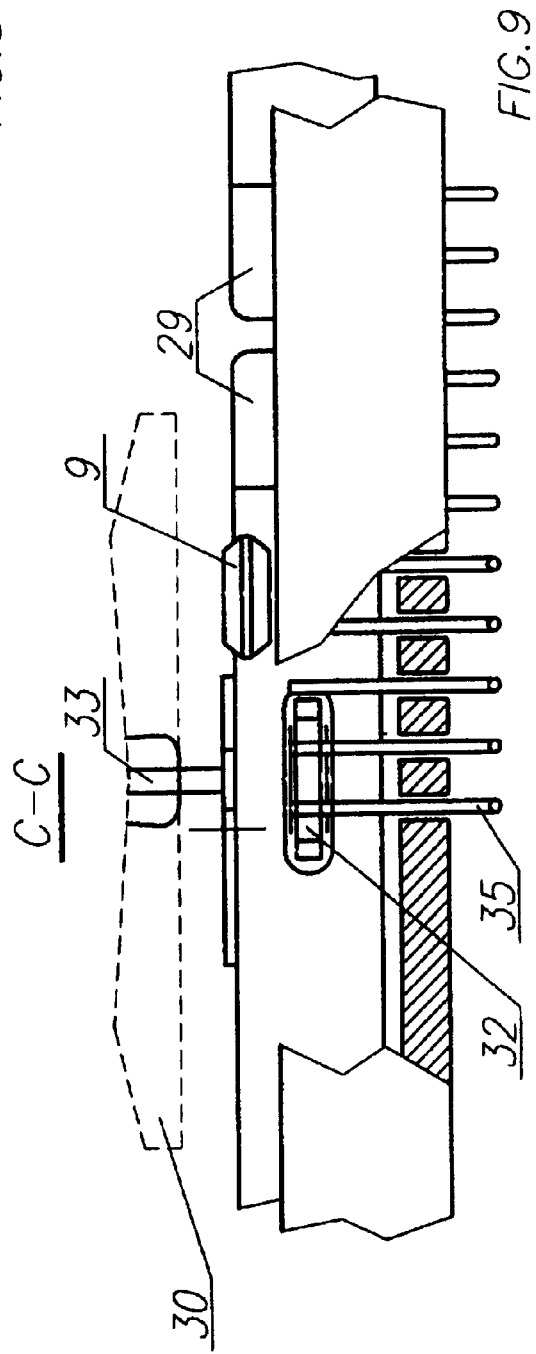

The carriers 6 with articles, schematically shown in FIGS. 1–3, actually are an assembled unit of carriers 29 and articles 30 (FIGS. 8 and 9). More in detail the articles carrier and its attitude fixation in interaction with the transportation rollers 8 and 9 are shown in FIGS. 4–7. During transportation through the locks 17 and chambers 18–21 the carriers 29 with articles 30 are rotated around their vertical axes. Positioning of the drive rollers 8 and bearing rollers 9 of the transportation means generally does not differ from that, shown in FIG. 1.

Figure 6:
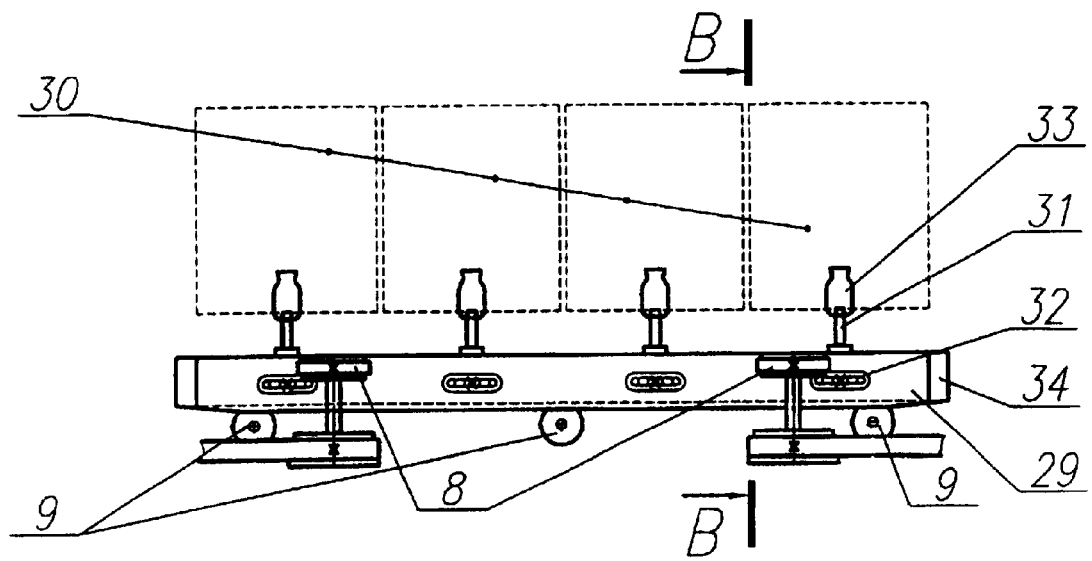
FIGS. 6 and 7 show front and side views of the carrier in an interaction with means of its fixation and transportation.
Figure 7:
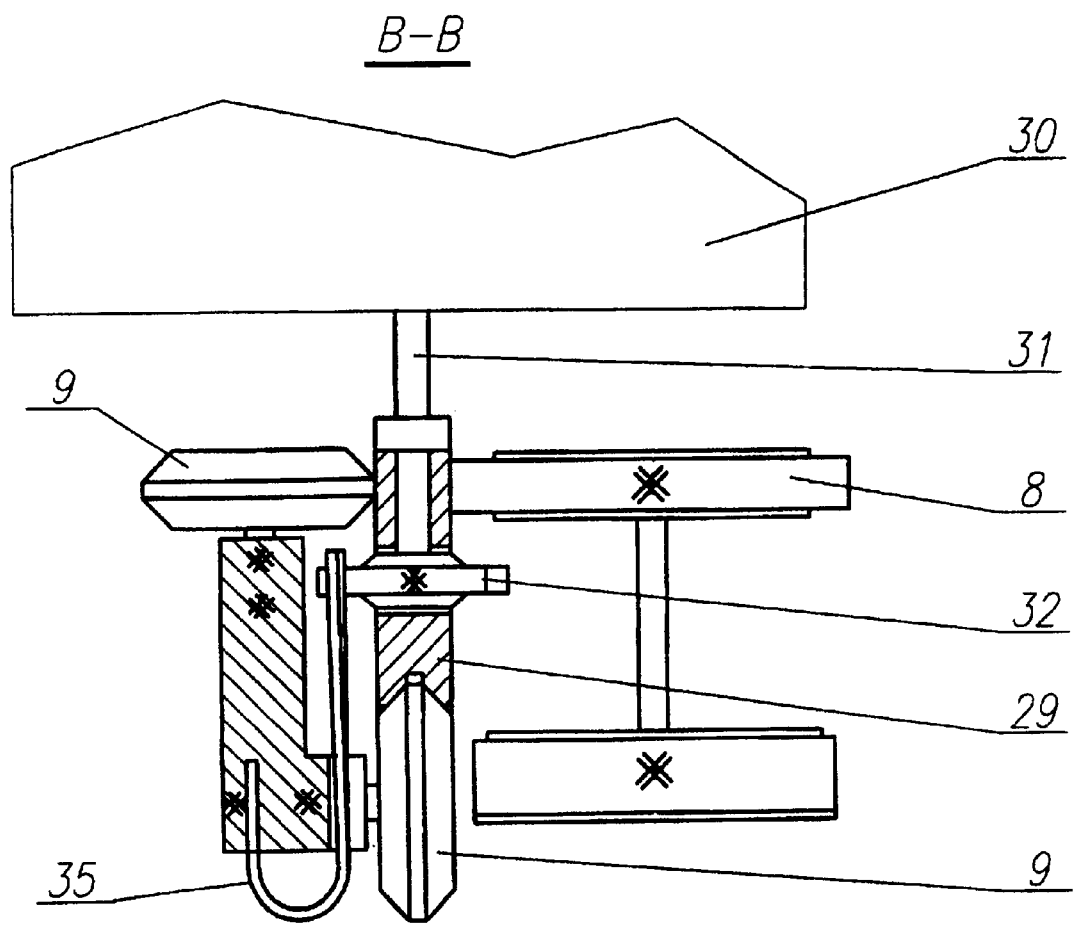

The front view of the carrier with articles interacting with the transportation means in the treatment chambers is shown in FIG. 6, where the articles 30, fixed on holders 31, provided with supports of articles 33 and sprocket wheels 32 to be rotated. The drive rollers 8 are appropriately coupled with drives (not shown). The drive rollers 8 are positioned relative bearing rollers 9 so, that to have a friction contact with one of the side paths 7 of the carrier 29. The ends of the carriers 29 have side chamfers 34 for thrust-free engagement into the said contact.

During transportation of the carriers 29 (FIGS. 8 and 9) in the treatment zones of the working chambers 18–21 with constant speed the sprocket wheels 32 of the carriers 29 interact with a number of pins 35, made with the possibility to limit counteraction. Thus the holders 31 are involved into rotation, providing all-round treatment of articles 30.

For continual movement of the carriers 29 through the working chambers 18–21 each of them should be in contact with two drive rollers 8 at any time. In the end zones of this path movement of the carriers should be changed from pulse mode into uniform mode and back. The end drive rollers with pulse drive and adjacent drive rollers with constant rotation should be equipped with freewheel clutches to eliminate possibility of conflict of these rollers at the carrier, common for them.

Industrial application of the invention may be in various areas. Particularly it is determined by the fact, that different metals or their compounds are vacuum deposited onto three-dimensional plastic parts in mass production in batch type vacuum machines, especially if the parts undergo preliminary and subsequent lacquering. Such equipment requires extensive use of manual labour. For such cases the present invention allows to combine all treatment steps into one general cycle with circulation of the carriers with articles, which is a constituent of the present invention.

What is claimed is:

1. An apparatus for flow-line treatment of articles under artificial atmosphere, the apparatus comprising at least a first chamber and a second chamber;

the first chamber comprising a vacuum working chamber provided with treatment means for processing of the articles;

means for maintaining the artificial atmosphere in the first chamber;

at least one lock at one end of the first chamber;

first transport means for transporting the articles through the first chamber and the at least one lock;

loading and unloading devices in the ambient atmosphere; and second transport means for transporting the articles though the second chamber;

wherein each lock comprises a movable body, installed inside an airtight shell, wherein each movable body comprises at least first and second cavities; the movable body is movable between a first position, in which the first cavity is in connection with the first chamber and the first transport means extend into the first cavity, and a second position, in which the first cavity is in connection with the second chamber, being located at another side of the lock, while the second transport means extend into the first cavity; and wherein an air gap seal is located between the shell and the body, wherein the at least first and second cavities are adjacent and similar and are provided with openings; each cavity is made with a volume for one carrier with articles; and the first and second transport means are made for simultaneous and antiparallel movement.

2. The apparatus according to claim 1, wherein the second chamber is a working chamber having an artificial atmosphere different from the artificial atmosphere in the first working chamber;

wherein the at least one lock is provided between at least the first and second working chambers; and the first or second transport means extend through at least the first and second working chambers and the at least one lock along one line.

3. The apparatus of claim 1, wherein the moveable bodies are rotatable and made in the form of a body of revolution.

4. The apparatus according to claim 3, wherein the body of revolution is in the form of a cylindrical shell having cylindrical surfaces, wherein a first gap is formed between the cylindrical surfaces and walls of the airtight shell and a second gap is formed between the ends of the cylindrical shell and the airtight shell, wherein the first gap and second gap form an airtight space, the airtight space containing an inert gas with marker properties under a pressure not more than $1/10$ of the atmospheric level, and the second gap is not more than a half of the first gap.

5. The apparatus as claimed in claim 4, wherein each of the carriers includes supports to hold the articles to be treated; each of the supports being positioned at the top end of a spindle, perpendicular to the carrier; wherein each of the spindles is a live spindle; and each of the live spindles is coupled with a sprocket wheel on one end;

wherein in all of the chambers and locks the transport means comprise driving rollers and bearing rollers to transport the carriers; and each of the chambers comprises one row of pins for engaging the sprocket wheels to make the supports rotate during movement of the carriers along the pins.

6. The apparatus according to claim 1, wherein the transport means comprise carriers which carry more than one independently rotatable article, and wherein each of the cavities have a volume sufficient to hold a carrier with a certain number of the independently rotatable articles.

7. The apparatus according to claim 1, wherein between the first chamber and the second chamber or between the first working chamber and the ambient atmosphere, at least one pair of adjacent locks are arranged in series; wherein auxiliary vacuum chambers are located between the adjacent pairs of locks and connected to means to admit atmospheric air into the auxiliary vacuum chamber.

8. The apparatus according to claim 7, wherein each of the auxiliary chambers is connected to a tank to admit atmosphere air, and the volume of the tank is substantially larger, and the pressure in the tank is lower, in comparison to the volume and pressure in the auxiliary chamber.

9. The apparatus according to claim 1, wherein the second chamber is a vacuum working chamber and the first chamber and the second chamber are adjacent and parallel to each other; wherein the transport means are arranged for simultaneous and antiparallel movement of the carriers through the first and second chambers.

10. The apparatus according to claim 9, wherein the loading and unloading devices are a combined loading/unloading unit at one end of the apparatus; the apparatus is provided with a turning lock between the first and second working chambers with lowest pressures at the end of the apparatus opposite to the loading/unloading unit; and the turning locks comprise locking compartments with openings at opposite ends.

11. The apparatus as claimed in claim 1, wherein each of the carriers includes supports to hold the articles to be treated; each of the supports being positioned at the top end of a spindle, perpendicular to the carrier; each of the spindles is a live spindle; and each of the live spindles is coupled with a sprocket wheel on one end; wherein in all of the chambers and locks, the transport means comprise driving rollers and bearing rollers to transport the carriers; and each of the chambers comprises one row of pins for engaging the sprocket wheels to make the supports rotate during movement of the carriers along the pins.

12. The apparatus according to claim 11, wherein the pins are resiliently attached to each of the chambers.

13. The apparatus according to claim 12, wherein the transport means provide a uniform movement of the carriers through a working zone of the working chamber and provides uniformly variable movement at the ends of the working chamber, while the driving rollers at the ends of each of the working chamber is provided with freewheel clutches.

14. The apparatus according to claim 11, wherein the transport means provide a uniform movement of the carriers through a working zone of the working chamber and provides uniformly variable movement at the ends of the working chamber, while the driving rollers at the end of the working chamber is provided with freewheel clutches.

15. The apparatus according to claim 1, comprising at least one working chamber provided with a magnetron sputtering device to coat three dimensional articles with metals or other materials.

16. The apparatus according to claims 1, further comprising an outgassing chamber, wherein the outgassing chamber is positioned before the working chamber provided with a magnetron sputtering device.

17. The apparatus according to claim 15, further comprising at least one working chamber designed to treat the surfaces of the articles by glow discharge.

18. The apparatus according to claim 1, comprising at least one working chamber provided with a thermal evaporation device to coat three dimensional articles with metals or other materials.

19. The apparatus according to claim 1, comprising at least one working chamber provided with an arc evaporation device to coat three dimensional articles with metals or other materials.

* * * * *